US012563666B2

(12) United States Patent
Sakamaki et al.

(10) Patent No.: US 12,563,666 B2
(45) Date of Patent: Feb. 24, 2026

(54) METAL SHEET MATERIAL, LAYERED BODY, INSULATED CIRCUIT BOARD, AND METAL SHEET MATERIAL MANUFACTURING METHOD

(71) Applicant: MITSUBISHI MATERIALS CORPORATION, Tokyo (JP)

(72) Inventors: Marina Sakamaki, Saitama (JP); Kenji Kubota, Naka (JP); Toyo Ohashi, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 158 days.

(21) Appl. No.: 18/283,519

(22) PCT Filed: Mar. 23, 2022

(86) PCT No.: PCT/JP2022/013602
§ 371 (c)(1),
(2) Date: Sep. 22, 2023

(87) PCT Pub. No.: WO2022/202912
PCT Pub. Date: Sep. 29, 2022

(65) Prior Publication Data
US 2024/0178115 A1      May 30, 2024

(30) Foreign Application Priority Data

Mar. 26, 2021      (JP) ................................. 2021-053445

(51) Int. Cl.
*H05K 1/09*        (2006.01)
*B32B 3/30*        (2006.01)
(Continued)

(52) U.S. Cl.
CPC ................. *H05K 1/09* (2013.01); *B32B 3/30* (2013.01); *B32B 15/08* (2013.01); *B32B 15/20* (2013.01);
(Continued)

(58) Field of Classification Search
CPC ........... H01L 23/49822; H01L 21/4857; H01L 24/29; H01L 24/32; H01L 2224/29109;
(Continued)

(56) References Cited

U.S. PATENT DOCUMENTS

| | | | |
|---|---|---|---|
| 9,578,741 B2 * | 2/2017 | Nagaura | ................ H05K 3/025 |
| 2005/0175826 A1 * | 8/2005 | Suzuki | .................... C25D 1/04 |
| | | | 428/209 |

FOREIGN PATENT DOCUMENTS

| | | |
|---|---|---|
| JP | H03-202500 A | 9/1991 |
| JP | 2000-077850 A | 3/2000 |

(Continued)

OTHER PUBLICATIONS

English Translation JPH320250; Matsushita Electronic Works LTD; Misturu; Published Sep. 4, 1991 (Year: 1991).*

(Continued)

*Primary Examiner* — Steven T Sawyer
(74) *Attorney, Agent, or Firm* — Troutman Pepper Locke LLP; James E. Armstrong, IV; Nicholas J. DiCeglie, Jr.

(57) ABSTRACT

This metal sheet material is made of copper or a copper alloy, and includes a main sheet body and a roughened plating layer that is formed on an outermost surface layer of the main sheet body. An engagement protrusion that protrudes toward the opposite side to the main sheet body and has a widening portion that gradually widens in width toward a tip end side in a protrusion direction is formed in the roughened plating layer. In a cross section of the main sheet body along the thickness direction, a plurality of the (Continued)

engagement protrusions are formed on a surface crystal grain that is located on the outermost surface of the main sheet body.

5 Claims, 3 Drawing Sheets

(51) Int. Cl.

| | |
|---|---|
| *B32B 15/08* | (2006.01) |
| *B32B 15/20* | (2006.01) |
| *C25D 3/38* | (2006.01) |
| *C25D 5/00* | (2006.01) |
| *C25D 5/18* | (2006.01) |
| *H01L 21/48* | (2006.01) |
| *H01L 23/498* | (2006.01) |
| *H01L 23/00* | (2006.01) |

(52) U.S. Cl.
CPC ................ *C25D 3/38* (2013.01); *C25D 5/18* (2013.01); *C25D 5/605* (2020.08); *C25D 5/617* (2020.08); *H01L 21/4857* (2013.01); *H01L 23/49822* (2013.01); *B32B 2250/02* (2013.01); *B32B 2255/06* (2013.01); *B32B 2255/205* (2013.01); *B32B 2307/202* (2013.01); *B32B 2307/206* (2013.01); *B32B 2457/08* (2013.01); *H01L 24/29* (2013.01); *H01L 24/32* (2013.01); *H01L 2224/29109* (2013.01); *H01L 2224/29111* (2013.01); *H01L 2224/29139* (2013.01); *H01L 2224/29147* (2013.01); *H01L 2224/32227* (2013.01); *H01L 2924/014* (2013.01)

(58) Field of Classification Search
CPC . H01L 2224/29111; H01L 2224/29139; H01L 2224/29147; H01L 2224/32227; H01L 2924/014; H01L 23/14; B32B 3/30; B32B 15/08; B32B 15/20; B32B 2250/02; B32B 2255/06; B32B 2255/205; B32B 2307/202; B32B 2307/206; B32B 2457/08; B32B 3/08; B32B 2307/538; B32B 2307/732; C25D 3/38; C25D 5/18; C25D 5/605; C25D 5/617; C25D 5/14; C25D 7/0614; C25D 1/04; C25D 5/627; H05K 1/181; H05K 3/0061; H05K 1/056; H05K 1/09; H05K 3/384; H05K 2201/0355; H05K 2203/0307; H05K 2203/0723; H05K 3/38; Y10T 428/12063; Y10T 428/12438; Y10T 428/12903; Y10T 428/1291; Y10T 428/12993; Y10T 428/24917; Y10T 428/25
See application file for complete search history.

(56) References Cited

FOREIGN PATENT DOCUMENTS

| | | |
|---|---|---|
| JP | 2006-351677 A | 12/2006 |
| JP | 2015-207666 A | 11/2015 |
| JP | 2020-158832 A | 10/2020 |
| JP | 2020-163650 A | 10/2020 |
| WO | 2016/038923 A1 | 3/2016 |

OTHER PUBLICATIONS

English Translation WO2020196265; Sano et al.; Published Oct. 1, 2020 (Year: 2020).*
Office Action mailed Sep. 10, 2024, issued for JP2023-509254 and English translation thereof.
International Search Report mailed May 31, 2023, issued for PCT/JP2022/013602 and English translation thereof.

* cited by examiner

METAL SHEET MATERIAL, LAYERED BODY, INSULATED CIRCUIT BOARD, AND METAL SHEET MATERIAL MANUFACTURING METHOD

TECHNICAL FIELD

The present invention relates to a metal sheet material, a layered body having a structure in which a resin member and a metal sheet material are laminated, an insulated circuit board, and a metal sheet material manufacturing method.

Priority is claimed on Japanese Patent Application No. 2021-053445, filed Mar. 26, 2021, the content of which is incorporated herein by reference.

BACKGROUND ART

In a power module, an LED module, and a thermoelectric module, a structure in which a power semiconductor element, an LED element, and a thermoelectric element are bonded is provided on an insulated circuit board in which a circuit layer made of a conductive material is formed on one surface of an insulating layer. As the insulating layer, an insulating layer made of ceramics or an insulating resin has been proposed.

Here, as an insulated circuit board provided with an insulating resin layer, for example, a metal-based circuit board has been proposed in Patent Document 1. In addition, a multilayer wiring board has been proposed in Patent Document 2.

In the metal-based circuit board described in Patent Document 1, an insulating resin layer is formed on a metal substrate, and a circuit layer having a circuit pattern is formed on this insulating resin layer. Here, the insulating resin layer is made of an epoxy resin that is a thermosetting resin, and the circuit layer is made of a copper foil.

Such a metal-based circuit board has a structure in which a semiconductor element is bonded onto the circuit layer, and a heat sink is arranged on the surface of the metal substrate on the opposite side of the insulating resin layer, and heat generated by the semiconductor element is thus transmitted to the heat sink side to be radiated.

In addition, the multilayer wiring board described in Patent Document 2 is manufactured in such a manner that a surface roughness (Ra) of a metal foil is set to 0.2 μm or greater, etching treatment is carried out on the metal foil adhered to a resin film, the etching treatment is further carried out on the metal foil to have a circuit pattern shape, thereby forming a wiring circuit layer, the wiring circuit layer formed on the surface of the resin film is embedded while applying pressure to a surface of a soft insulating sheet, the wiring circuit layer is transferred to the surface of the insulating sheet to obtain a plurality of insulating sheets, and the plurality of insulating sheets thus obtained are laminated and heat-cured all at once.

CITATION LIST

Patent Documents

[Patent Document 1]
  Japanese Unexamined Patent Application, First Publication No. 2015-207666
[Patent Document 2]
  Japanese Unexamined Patent Application, First Publication No. 2000-077850

SUMMARY OF INVENTION

Technical Problem

In an insulated circuit board having a structure in which a metal sheet or the like is bonded to an insulating resin layer to form a circuit layer, it is required to ensure the adhesion between the insulating resin layer and the circuit layer (metal sheet) so that peeling of the circuit layer (metal sheet) from the insulating resin layer does not occur during use.

Here, in the metal-based circuit board described in Patent Document 1, since improvement of the adhesion between the insulating resin layer and the circuit layer is not considered, there is the risk of the occurrence of peeling of the circuit layer (metal sheet) from the insulating resin layer during use.

On the other hand, in the multilayer wiring board described in Patent Document 2, improvement of the adhesion between the insulating sheet and the wiring circuit layer is attempted by embedding the wiring circuit layer in the insulating sheet with the surface roughness (Ra) set to 0.2 μm or greater.

Here, in a case where the circuit layer is made of pure copper such as oxygen-free copper having excellent thermal conductivity and electrical conductivity, for example, crystal grains are likely to be coarsened. In addition, even in a case where the circuit layer is formed to be thick, crystal grains tend to be coarsened.

There was a risk that in a case where the crystal grains of the metal sheet constituting the circuit layer are coarsened, fine irregularities are not formed even after the etching treatment, and the adhesion to the insulating sheet cannot be secured even though the surface roughness (Ra) is 0.2 μm or greater.

The present invention has been made in view of the circumstances described above, and an object of the present invention is to provide a metal sheet material having excellent adhesion to a laminated resin member, a layered body in which the metal sheet material and the resin member are laminated, an insulated circuit board, and a metal sheet material manufacturing method.

Solution to Problem

In order to solve the above-described problems, a metal sheet material of the present invention includes a main sheet body and a roughened plating layer that is formed on an outermost surface layer of the main sheet body, in which an engagement protrusion that protrudes toward an opposite side to the main sheet body and has a widening portion that gradually widens in width toward a tip end side in a protrusion direction is formed in the roughened plating layer, in a cross section of the main sheet body along the thickness direction, a plurality of the engagement protrusions are formed on a surface crystal grain that is located on the outermost surface of the main sheet body, and when a protrusion height of the engagement protrusions is denoted by H (unit: μm), a maximum width of the surface crystal grain is denoted by W (unit: μm), and the number of the engagement protrusions in the maximum width of the surface crystal grain is denoted by N, $N \times H / W$ is 0.5 or greater.

According to the metal sheet material having this configuration, as the engagement protrusions each of which protrudes toward the opposite side to the main sheet body and has the widening portion that gradually widens in width toward the tip end side in the protrusion direction are formed in the roughened plating layer that is formed on an outermost surface layer, the engagement protrusions may engage with a resin member in a case where the resin member is laminated on a sheet surface of this metal sheet material. Therefore, the adhesion to the laminated resin member can be improved.

Furthermore, when the protrusion height of the engagement protrusions is denoted by H (unit: μm), the maximum width of the surface crystal grain is denoted by W (unit: μm), and the number of the engagement protrusions in the maximum width of the surface crystal grain is denoted by N, N×H/W is 0.5 or greater, the engagement protrusions may be sufficiently formed even though the crystal grain of the main sheet body has been coarsened. Therefore, the adhesion to the laminated resin member can be improved.

Here, in the metal sheet material of the present invention, the maximum width of the surface crystal grain may be 3 μm or greater.

In this case, even though the maximum width of the surface crystal grain on the main sheet body is coarsened to 3 μm or greater, the metal sheet material can sufficiently engage with the laminated resin member. Therefore, the adhesion to the resin member can be improved.

In addition, in the metal sheet material of the present invention, the protrusion height of the engagement protrusions is preferably 0.1 μm or greater.

In this case, as the protrusion height of the engagement protrusions is 0.1 μm or greater, it is possible to reliably improve the adhesion to the laminated resin member.

Furthermore, in the metal sheet material of the present invention, the main sheet body is preferably made of copper or a copper alloy.

In this case, as the main sheet body is made of copper or a copper alloy, the electrical conductivity and the thermal conductivity are excellent. Furthermore, even though the crystal grain size of the main sheet body is coarsened, the metal sheet material can sufficiently engage with the laminated resin member. Therefore, the adhesion to the resin member can be improved.

The layered body of the present invention is a layered body in which the resin member is laminated on a sheet surface of the above-described metal sheet material, and has a feature in which the resin member engages with the engagement protrusions of the metal sheet material at a bonded interface between the resin member and the metal sheet material.

According to the layered body having this configuration, the resin member is laminated on a sheet surface of the metal sheet material on which the engagement protrusions each of which has the widening portion that gradually widens in width toward the tip end side in the protrusion direction are formed, and the resin member engages with the engagement protrusions of the metal sheet material at the bonded interface between the resin member and the metal sheet material. Therefore, the adhesion between the resin member and the metal sheet material can be improved.

The insulated circuit board of the present invention is an insulated circuit board including an insulating resin layer and a circuit layer formed on one surface of the insulating resin layer, and has a feature in which the above-described metal sheet material is bonded to the one surface of the insulating resin layer to form the circuit layer, and the insulating resin layer engages with the engagement protrusions of the metal sheet material at a bonded interface between the insulating resin layer and the circuit layer.

According to the insulated circuit board having this configuration, the metal sheet material on which the engagement protrusions each of which has the widening portion that gradually widens in width toward the tip end side in the protrusion direction are formed is bonded to the one surface of the insulating resin layer to form the circuit layer, and the insulating resin layer engages with the engagement protrusions of the circuit layer (copper member) at the bonded interface between the insulating resin layer and the circuit layer. Therefore, the adhesion between the circuit layer and the insulating resin layer can be improved.

The metal sheet material manufacturing method of the present invention is a method for manufacturing the above-described metal sheet material and has a feature of performing direct current electrolytic plating and then PR pulse electrolytic plating on the main sheet body to form the roughened plating layer on the outermost surface layer of the main sheet body.

According to the metal sheet material manufacturing method having this configuration, as direct current electrolytic plating is performed on the main sheet body and thereafter PR pulse electrolytic plating is performed thereon, the plurality of fine engagement protrusions can be formed in a dispersed manner on a surface of the large surface crystal grain even though the surface crystal grain of the main sheet body is large.

Advantageous Effects of Invention

According to the present invention, it is possible to provide a metal sheet material having excellent adhesion to a laminated resin member, a layered body in which this metal sheet material and the resin member are laminated, an insulated circuit board, and a metal sheet material manufacturing method.

DESCRIPTION OF EMBODIMENTS

Figure 1:
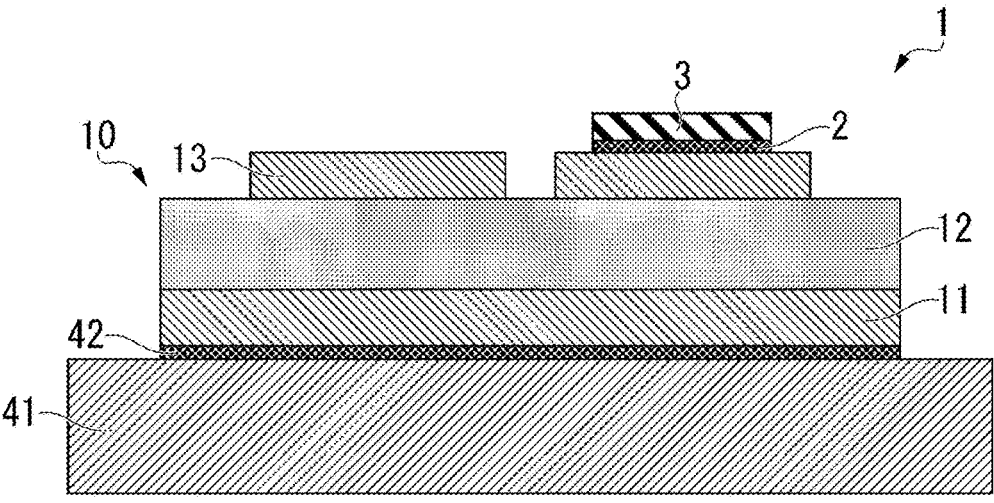
FIG. 1 is a schematic explanatory diagram of a power module provided with an insulated circuit board according to an embodiment of the present invention.

Hereinbelow, a metal sheet material, a layered body, and an insulated circuit board according to an embodiment of the present invention will be described with reference to the accompanying drawings.

The layered body according to the present embodiment is an insulated circuit board 10 including an insulating resin layer 12 that is a resin member, a metal sheet material 30 (circuit layer 13) according to the present embodiment, and a metal substrate 11, with each side of the insulating resin layer 12 being bonded to the metal sheet material 30 and the metal substrate 11.

FIG. 1 shows the insulated circuit board 10 according to the embodiment of the present invention and a power module 1 using the insulated circuit board 10.

The power module 1 shown in FIG. 1 is provided with the insulated circuit board 10, a semiconductor element 3 that is bonded, through a first solder layer 2, to one surface (upper surface shown in FIG. 1) of the insulated circuit board 10, and a heat sink 41 that is bonded, through a second solder layer 42, to the other side (lower side shown in FIG. 1) of the insulated circuit board 10.

The semiconductor element 3 is made of a semiconductor material such as Si. The first solder layer 2 for bonding the insulated circuit board 10 and the semiconductor element 3 is made of, for example, a Sn—Ag-based, Sn—Cu-based, Sn—In-based, or Sn—Ag—Cu-based solder material (a so-called lead-free solder material).

The heat sink 41 is for radiating heat from the insulated circuit board 10 side. The heat sink 41 is made of copper or a copper alloy, aluminum or an aluminum alloy, or the like, which have good thermal conductivity. In the present embodiment, the heat sink is a heat radiation sheet made of oxygen-free copper. The thickness of the heat sink 41 is set within a range of 3 mm or greater and 10 mm or smaller.

Here, the insulated circuit board 10 and the heat sink 41 are bonded through the second solder layer 42. This second solder layer 42 can have the same configuration as the above-described first solder layer 2.

As shown in FIG. 1, the insulated circuit board 10 of the present embodiment includes the metal substrate 11, the insulating resin layer 12 formed on one surface (upper surface shown in FIG. 1) of the metal substrate 11, and the circuit layer 13 formed on one surface (upper surface shown in FIG. 1) of the insulating resin layer 12.

The metal substrate 11 has an action of improving a heat dissipating feature by spreading heat generated in the semiconductor element 3 mounted on the insulated circuit board 10 in a plane direction. Therefore, the metal substrate 11 is made of a metal having excellent thermal conductivity, for example, copper or a copper alloy, or aluminum or an aluminum alloy. In the present embodiment, the metal substrate 11 is made of a rolled plate composed of oxygen-free copper. The thickness of the metal substrate 11 is set within a range of 0.05 mm or greater and 3 mm or smaller, and is set to 2.0 mm in the present embodiment.

The insulating resin layer 12 prevents electrical connection between the circuit layer 13 and the metal substrate 11, and is made of a thermosetting resin with insulation properties.

In the present embodiment, a thermosetting resin containing a filler may be used to ensure the strength of the insulating resin layer 12 and to ensure the thermal conductivity. Here, as the filler, for example, alumina, boron nitride, aluminum nitride, or the like can be used. In addition, as the thermosetting resin, an epoxy resin, a polyimide resin, or other resins can be used. In the present embodiment shown in FIG. 3, the insulating resin layer 12 is made of an epoxy resin containing no filler. In another embodiment, the insulating resin layer 12 is made of an epoxy resin containing boron nitride as a filler. The thickness of the insulating resin layer 12 is within a range of 20 μm or greater and 250 μm or smaller, and is 150 μm in the present embodiment.

As shown in FIG. 5(a), the circuit layer 13 is formed by bonding the metal sheet material 30 (circuit layer 13) according to the present embodiment to one surface (upper surface in FIG. 5(a)) of the insulating resin layer 12.

In this circuit layer 13, a circuit pattern is formed, and one surface (upper surface shown in FIG. 1) thereof is a mounting surface on which the semiconductor element 3 is mounted. Here, the thickness of the circuit layer 13 is set to be within a range of 0.3 mm or greater and 3 mm or smaller, and is set to 0.5 mm in the present embodiment.

Here, the metal sheet material 30 according to the present embodiment, which constitutes the circuit layer 13 described above, will be described with reference to FIGS. 2(a) and 2(b).

The metal sheet material 30 according to the present embodiment is made of a metal having excellent electrical conductivity and thermal conductivity. In the present embodiment, the metal sheet material 30 is made of copper or a copper alloy, and is specifically made of oxygen-free copper.

As shown in FIG. 2(a), the metal sheet material 30 according to the present embodiment includes a main sheet body 31 and a roughened plating layer 35 formed on an outermost surface layer of the main sheet body 31.

As shown in FIG. 2(a), an engagement protrusion 36 that protrudes toward the opposite side (the upper side in FIG. 2(a)) to the main sheet body 31 and has a widening portion 36a that gradually widens in width toward a tip end side in a protrusion direction is formed in this roughened plating layer 35.

The roughened plating layer 35 may be a constituent material different from the metal sheet material 30 and is preferably made of a material having further excellent thermal conductivity than the insulating resin layer 12. In the present embodiment, the roughened plating layer 35 is made of copper or a copper alloy having the same composition as that of the metal sheet material 30.

Here, in a cross section of the main sheet body 31 along the thickness direction, as shown in FIG. 2(a), a plurality of the engagement protrusions 36 are formed on a surface crystal grain 32 that is located on the outermost surface of the sheet surface, and when a protrusion height of each of the engagement protrusions 36 is denoted by H (unit: μm), a maximum width of the surface crystal grain 32 is denoted by W (unit: μm), and the number of the engagement protrusions 36 in the maximum width W of the surface crystal grain 32 is denoted by N, N×H/W is 0.5 or greater.

The maximum width W of the surface crystal grain 32 is measured at an interface between the main sheet body 31 and the roughened plating layer 35, as shown in FIG. 2(a).

In addition, in the metal sheet material 30 according to the present embodiment, the maximum width W of the surface crystal grain 32 located on the outermost surface of the sheet surface may be 3 μm or greater. There is no particular upper limit on the maximum width W, but in most cases, the maximum width is 200 μm or smaller, and the maximum is 1000 μm.

The maximum width W of the surface crystal grain 32 located on the outermost surface of the sheet surface can be obtained by, as shown in FIG. 2(a), observing a cross section of the main sheet body 31 along the thickness direction with a scanning electron microscope (SEM) and measuring the width of the crystal grain that is in contact with the roughened plating layer 35 in a direction orthogonal to the thickness direction.

That is, an interface between the main sheet body 31 and the roughened plating layer 35, which is observed in the cross section of the main sheet body 31 and the roughened plating layer 35 along the thickness direction, is observed with a scanning electron microscope (SEM) (1000-fold magnification), the measurement of the maximum width of the surface crystal grain 32 in a field of view of 85 μm×120

μm is performed three times, and the maximum width W is defined as the maximum value among the three measurements.

Furthermore, in the metal sheet material 30 according to the present embodiment, the protrusion height H of each of the engagement protrusions 36 is 0.1 μm or greater.

Figure 2:
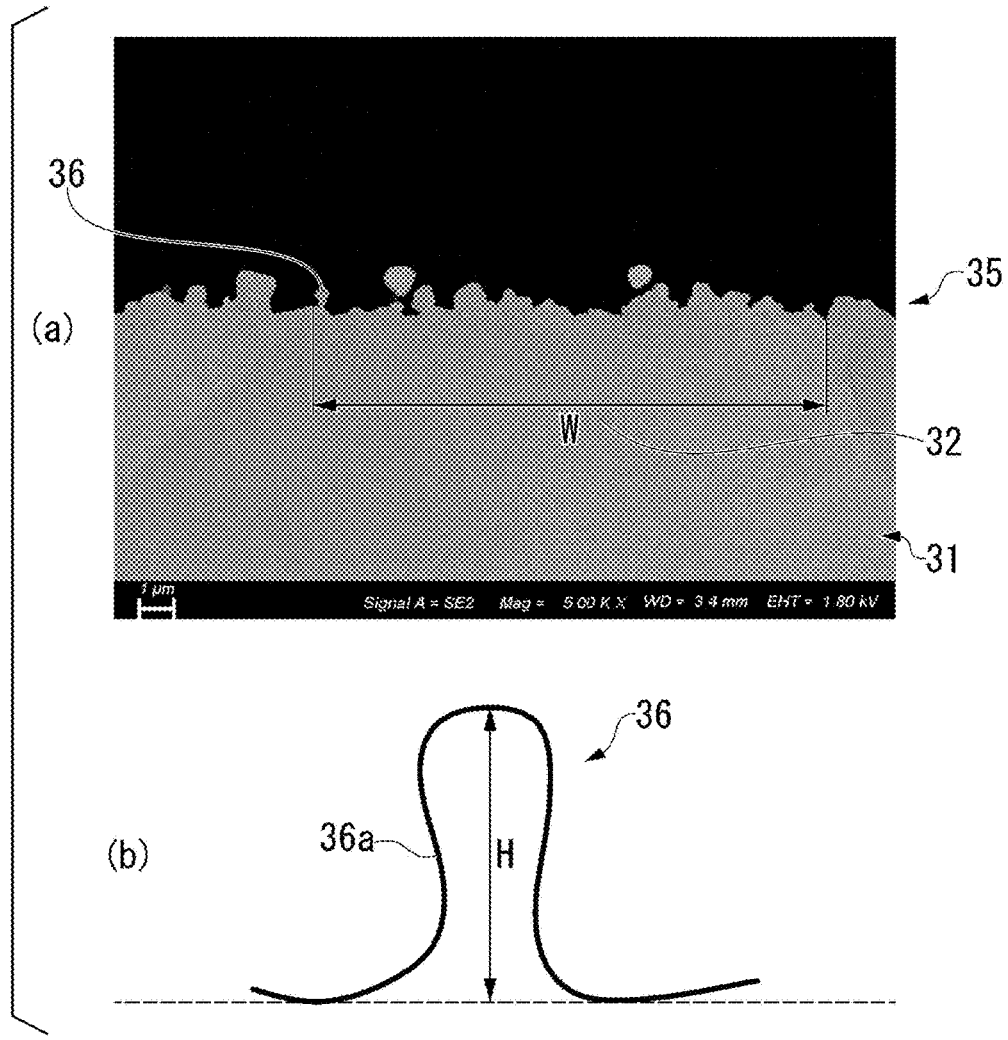
FIG. 2 is an explanatory diagram of a metal sheet material according to the embodiment of the present invention. (a) is an observation photograph of the vicinity of a surface, and (b) is a schematic diagram of an engagement protrusion.

The protrusion height H of each of the engagement protrusions 36 can be measured by, as shown in FIG. 2(*b*), observing the cross section of the main sheet body 31 along the thickness direction, and measuring, as the height, the distance from the reference line (broken line in FIG. 2(*b*)) connecting valley bottoms on both sides of one engagement protrusion 36 to the top of the one engagement protrusion 36.

More specifically, a cross section of the roughened plating layer 35 along the thickness direction is observed by SEM (5000-fold magnification), and in all engagement protrusions observed in a field of view of 16 μm×23 μm, each distance from the reference line connecting valley bottoms on both sides of each engagement protrusion to the top of the engagement protrusion is measured, and an average value of the obtained values is determined as the protrusion height of the engagement protrusions in a field of view of 16 μm×23 μm. This measurement is performed three times, and an average value thereof is determined as the protrusion height H of the engagement protrusions.

Figure 3:
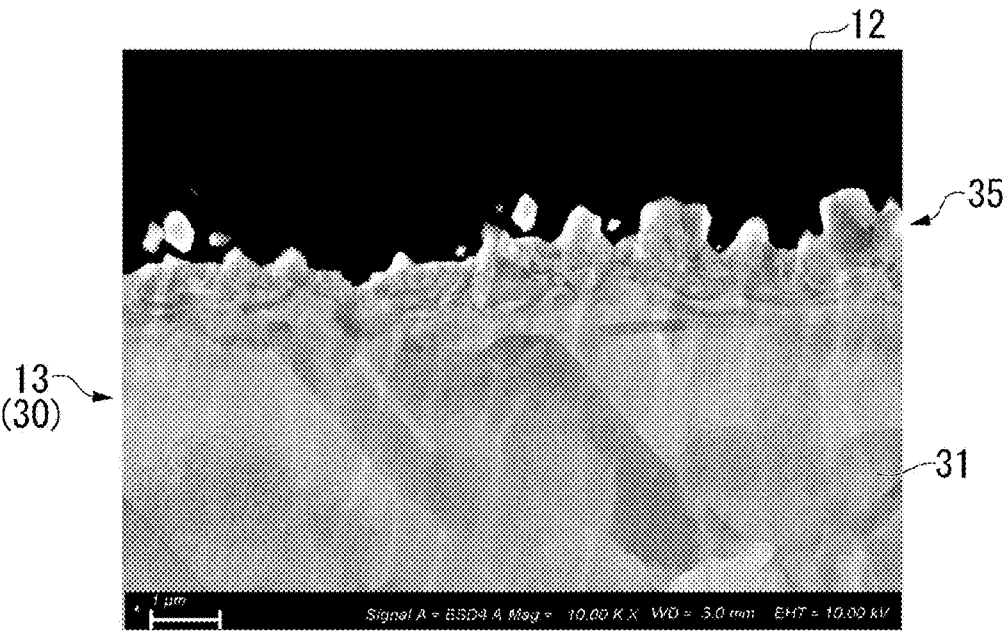
FIG. 3 is an observation photograph of a bonded interface between a circuit layer and an insulating resin layer of the insulated circuit board according to the embodiment of the present invention.

As shown in FIG. 3, the insulated circuit board 10 according to the present embodiment has a structure in which the insulating resin layer 12 engages with the engagement protrusions 36 of the circuit layer 13 (metal sheet material 30) at a bonded interface between the insulating resin layer 12 and the circuit layer 13, and the circuit layer 13 (metal sheet material 30) and the insulating resin layer 12 are impregnated with each other.

Figure 5:
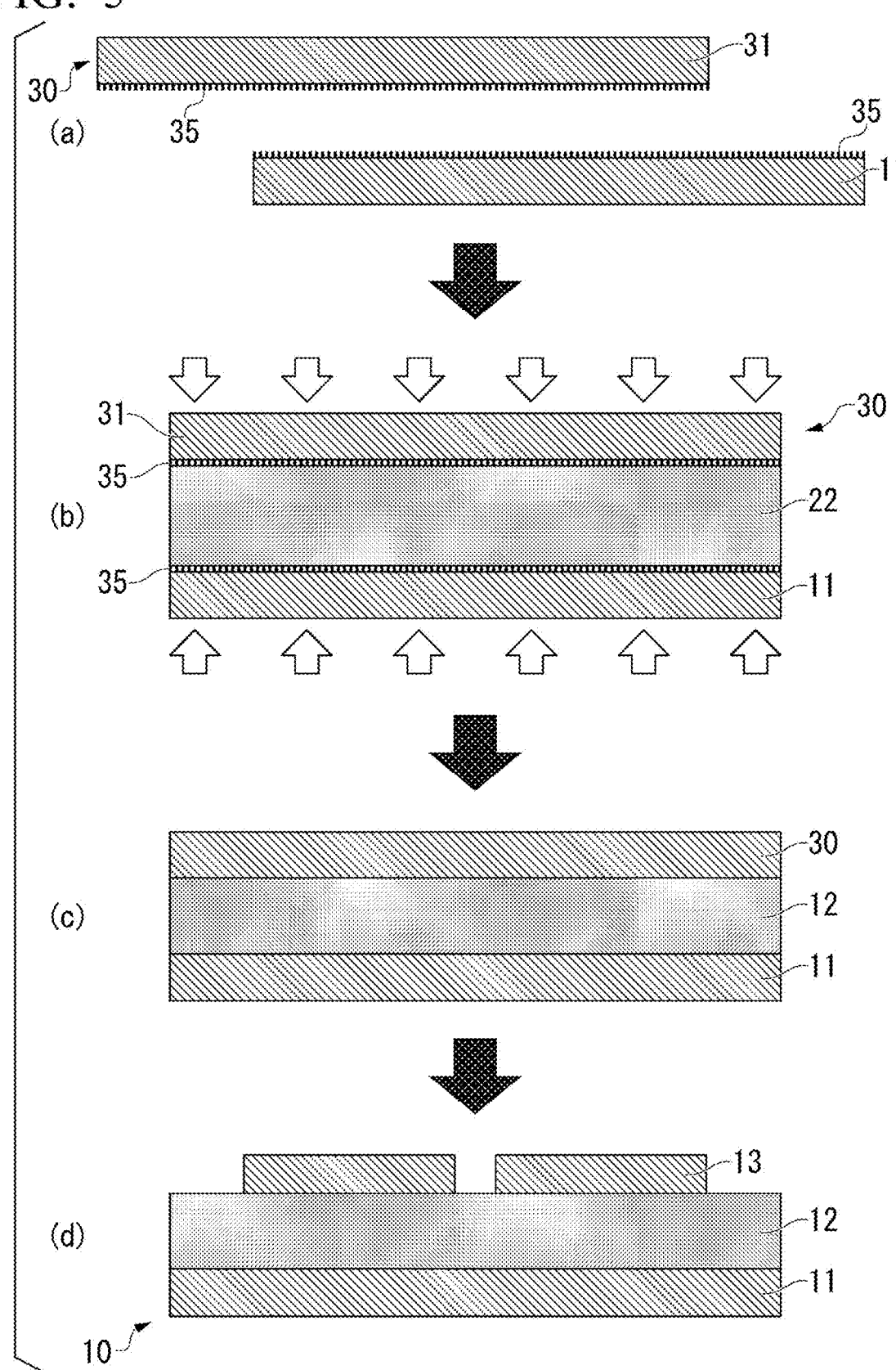
FIG. 5 is a schematic explanatory diagram of the method for manufacturing an insulated circuit board shown in FIG. 4.

In addition, in the present embodiment, as shown in FIG. 5(*a*), even in the metal substrate 11, the roughened plating layer 35 having the above-described engagement protrusions is formed on a bonding surface between the metal substrate 11 and the insulating resin layer 12 similar to the metal sheet material 30. In addition, a structure, in which the insulating resin layer 12 engages with the engagement protrusions of the metal substrate 11 at a bonded interface between the insulating resin layer 12 and the metal substrate 11, and the metal substrate 11 and the insulating resin layer 12 are impregnated with each other, is employed.

Hereinbelow in the metal sheet material 30 constituting the circuit layer 13 of the insulated circuit board 10 according to the present embodiment, the reason the number N of the engagement protrusions 36 in the maximum width of the surface crystal grain of the main sheet body 31, the maximum width W of the surface crystal grain 32, the protrusion height H of the engagement protrusions, and N×H/W are defined as above will be described.

(Number N of Engagement Protrusions 36 in Maximum Width W of Surface crystal grain 32 of Main Sheet Body 31)

In the metal sheet material 30 of the present embodiment, the plurality of engagement protrusions 36 are formed on the surface crystal grain 32 of the main sheet body 31. Here, the number N of the engagement protrusions 36 in the maximum width W of the surface crystal grain 32 of the main sheet body 31 is the number N of the engagement protrusions 36 that are formed on the surface crystal grain 32 of the main sheet body 31, which has the maximum width W. In a case where the number N of the engagement protrusions 36 is small, there is a concern that the adhesion to the insulating resin layer 12 may be insufficient.

(Maximum Width W of Surface crystal grain)

In the metal sheet material 30 of the present embodiment, a sufficient number of engagement protrusions 36 are provided even in a case where the maximum width W of the surface crystal grain of the main sheet body 31 is 3 μm or greater, that is, a case where the crystal grain of the main sheet body 31 is coarsened. Therefore, the adhesion between the circuit layer 13 (metal sheet material 30) and the insulating resin layer 12 can be improved.

In particular, in the present embodiment, the crystal grain is likely to be coarsened, but a sufficient number of the engagement protrusions 36 can be secured because the metal sheet material 30 is formed of oxygen-free copper having excellent thermal conductivity and electrical conductivity. Therefore, a configuration of the insulated circuit board 10 having excellent thermal conductivity and electrical conductivity can be achieved.

The lower limit of the maximum width W of the surface crystal grain of the main sheet body 31 is not particularly limited. In addition, the upper limit of the maximum width W of the surface crystal grain of the main sheet body 31 is not particularly limited, but is preferably 50 μm or smaller, and still more preferably 25 μm or smaller.

(Protrusion Height of Engagement Protrusions)

In the metal sheet material 30 of the present embodiment, in a case where the protrusion height H of the engagement protrusions 36 is 0.1 μm or greater, the engagement protrusions 36 engage with the insulating resin layer 12 more sufficiently. Therefore, the adhesion between the circuit layer 13 and the insulating resin layer 12 can be further improved.

In order to further improve the adhesion between the circuit layer 13 and the insulating resin layer 12, the protrusion height H of the engagement protrusions 36 is preferably 0.5 μm or greater and more preferably 1.0 μm or greater, and may be 2.0 μm or greater.

In addition, the upper limit of the protrusion height H of the engagement protrusions 36 is not particularly limited, but in order to ensure sufficient insulation properties in the insulating resin layer 12, the protrusion height H of the engagement protrusions 36 is preferably 15.0 μm or smaller, still more preferably 10.0 μm or smaller, and more preferably 6.0 μm or smaller.

(N×H/W)

In the metal sheet material 30 of the present embodiment, the plurality of engagement protrusions 36 are formed on the surface crystal grain 32 of the main sheet body 31. Here, regarding the protrusion height H (unit: μm) of the engagement protrusions 36, the maximum width W (unit: μm) of the surface crystal grain 32, and the number N of the engagement protrusions 36 in the maximum width W of the surface crystal grain 32, in a case where N×H/W is smaller than 0.5, the number of the engagement protrusions 36 in the maximum width W of the surface crystal grain 32 is insufficient, or the protrusion height of the engagement protrusions 36 is insufficient. As a result, there is a concern that the adhesion to the insulating resin layer 12 may be insufficient.

Thus, in the present embodiment, a value of N×H/W in the maximum width W of the surface crystal grain 32 of the main sheet body 31 is set to 0.5 or greater.

In addition, in order to further improve the adhesion between the circuit layer 13 (metal sheet material 30) and the insulating resin layer 12, a value of N×H/W of the main sheet body 31 is preferably set to 1.0 or greater, and still more preferably 2.0 or greater.

The upper limit of the value of N×H/W of the main sheet body 31 is not limited, but the value of N×H/W is about 10 or smaller.

Next, a method for manufacturing the insulated circuit board 10 according to the present embodiment will be described with reference to FIGS. 4 to FIGS. 5(a) to 5(d).

(Surface-Roughening Step S01)

First, the roughened plating layer 35 is formed on a surface of the main sheet body 31 in the metal sheet material 30 serving as the circuit layer 13. In the present embodiment, the roughened plating layer 35 is also formed on the metal substrate 11 (see FIG. 5(a)). This roughened plating layer 35 is formed as follows.

Electrolytic plating treatment is performed on a bonding surface of the main sheet body 31 (and metal substrate 11). In the present embodiment, it is preferable to use an electrolytic solution consisting of an aqueous solution in which 3,3'-dithiobis(1-propane sulfonic acid)2 sodium is added into a copper sulfate bath containing copper sulfate ($CuSO_4$) and sulfuric acid ($H_2SO_4$) as main components, as an electrolytic plating solution. The temperature of the plating bath is preferably within a range of, for example, 25° C. or higher and 35° C. or lower.

As the electrolytic plating treatment, firstly a direct current electrolytic plating method is performed, and thereafter a periodic reverse (PR) pulse electrolytic plating method is performed.

In the direct current electrolytic plating method, the current density is set within a range of 1 A/dm$^2$ or greater and 20 A/dm$^2$ or smaller, and the application time is set within a range of 10 seconds or longer and 120 seconds or shorter.

Here, by performing the direct current electrolytic plating method firstly as the electrolytic plating treatment and performing PR pulse electrolytic plating method, the fine engagement protrusions 36 can be formed in a dispersed manner on the surface of the large surface crystal grain even though the surface crystal grain of the main sheet body 31 is large.

The PR pulse electrolytic plating method is a method of performing electrolytic plating by energizing while periodically reversing a direction of the current. For example, positive electrolysis (anodic electrolysis in which the main sheet body 31 (and the metal substrate 11) serves as an anode) of 1 A/dm$^2$ or greater and 30 A/dm$^2$ or smaller is set to 1 ms or greater and 1000 ms or smaller, and negative electrolysis (cathode electrolysis in which the main sheet body 31 (and the metal substrate 11) serves as a cathode) of 1 A/dm$^2$ or greater and 30 A/dm$^2$ or smaller is set to 1 ms or greater and 1000 ms or smaller, which is repeated. As a result, the melting of the surface of the main sheet body 31 (and the metal substrate 11) and the precipitation of copper are repeatedly carried out, thereby forming the roughened plating layer 35.

Here, the number of the engagement protrusions 36 in the roughened plating layer 35 can be adjusted depending on the surface properties of the main sheet body 31 (and the metal substrate 11) on which the roughened plating layer 35 is formed, and various plating conditions (pulse application time, pulse waveform (precipitation amount/dissolution amount ratio), pulse frequency).

For example, in a case where the pulse application time is lengthened, or a case where the precipitation amount/dissolution amount ratio is adjusted as a pulse waveform, the size of each of the engagement protrusions 36 provided with the widening portion 36a that gradually widens in width toward the tip end side in the protrusion direction can be increased.

In addition, by adjusting the pulse frequency, the number of the engagement protrusions 36 can be increased.

(Lamination Step S02)

Next, a resin composition 22 containing boron nitride as a filler, an epoxy resin as a thermosetting resin, and a curing agent is arranged on one surface (upper surface shown in FIG. 5(b)) of the metal substrate 11. In the present embodiment, the resin composition 22 is formed in a sheet shape.

The metal sheet material 30 serving as the circuit layer 13 is also arranged on one surface (upper surface shown in FIG. 5(b)) of this resin composition 22.

The resin composition 22 is laminated on each of the surfaces on which the roughened plating layers 35 of the metal sheet material 30 and the metal substrate 11 are formed.

(Thermocompression Bonding Step S03)

Next, as shown in FIG. 5(b), the metal substrate 11, the resin composition 22, and the metal sheet material 30, which have been laminated, are heated and pressurized in a lamination direction, the resin composition 22 is cured to form the insulating resin layer 12, and the metal substrate 11 and the insulating resin layer 12, and the insulating resin layer 12 and the metal sheet material 30 are bonded to each other (see FIG. 5(c)).

In this thermocompression bonding step S03, conditions in which a heating temperature is within a range of 150° C. or higher and 400° C. or lower, a holding time at the heating temperature is within a range of 15 minutes or longer and 90 minutes or shorter, and a pressurizing pressure in the lamination direction is within a range of 1 MPa or greater and 100 MPa or smaller are preferably employed.

(Circuit Pattern-Forming Step S04)

Next, the metal sheet material 30 bonded to the insulating resin layer 12 is subjected to etching treatment to form a circuit pattern, thereby forming the circuit layer 13.

As described above, as shown in FIG. 5(d), the insulated circuit board 10 according to the present embodiment is manufactured.

(Heat Sink-Bonding Step S05)

Next, the heat sink 41 is bonded to the other surface of the metal substrate 11 of this insulated circuit board 10. In the present embodiment, the metal substrate 11 and the heat sink 41 are bonded through a solder material.

(Semiconductor Element-Bonding Step S06)

The semiconductor element 3 is bonded to the circuit layer 13 of the insulated circuit board 10. In the present embodiment, the circuit layer 13 and the semiconductor element 3 are bonded to each other through a solder material.

The power module 1 shown in FIG. 1 is manufactured by the above-described steps.

According to the metal sheet material 30 and the insulated circuit board 10 (layered body) of the present embodiment with the above-described configuration, as the engagement protrusions 36 each of which protrudes toward the opposite side to the main sheet body 31 and has the widening portion 36a that gradually widens in width toward the tip end side in the protrusion direction are formed in the roughened plating layer 35 that is formed on the outermost surface layer of the main sheet body 31, the engagement protrusions 36 of the circuit layer 13 (metal sheet material 30) engage with the insulating resin layer 12 at the bonded interface between the circuit layer 13 (metal sheet material 30) and the insulating resin layer 12. Therefore, the adhesion between the circuit layer 13 (metal sheet material 30) and the insulating resin layer 12 can be improved.

Furthermore, as a ratio of the number of the engagement protrusions 36 to the maximum width W of the surface crystal grain 32 is 0.4 pieces/μm or greater, the engagement protrusions 36 can be sufficiently formed even though the crystal grain of the main sheet body 31 is coarsened. Therefore, the adhesion between the circuit layer 13 (metal sheet material 30) and the insulating resin layer 12 can be improved.

In the present embodiment, even in a case where the maximum width W of the surface crystal grain 32 of the circuit layer 13 (metal sheet material 30) is coarsened to 3 μm or greater, the engagement protrusions 36 can be sufficiently formed. Therefore, the adhesion between the circuit layer 13 (metal sheet material 30) and the insulating resin layer 12 can be improved.

In addition, the main sheet body 31 can be made of a metal (oxygen-free copper in the present embodiment) having relatively coarse crystal grains, and the thermal conductivity and the electrical conductivity of the main sheet body 31 can be improved.

In the present embodiment, in a case where the protrusion height H of the engagement protrusions 36 is 0.1 μm or greater, the adhesion between the circuit layer 13 (metal sheet material 30) and the insulating resin layer 12 can be further improved.

In addition, according to the metal sheet material manufacturing method of the present embodiment, in the surface-roughening step S01 of forming the roughened plating layer on the surface of the main sheet body, a configuration in which the bonding surface of the main sheet body 31 (and the metal substrate 11) is subjected to an electrolytic plating treatment is employed, and as the electrolytic plating treatment, firstly, the direct current electrolytic plating method is performed, and thereafter, the PR pulse electrolytic plating method is performed. Therefore, the fine engagement protrusions 36 can be formed in a dispersed manner on the surface of the large surface crystal grain even in a case where the surface crystal grain of the main sheet body 31 is large.

Although the embodiments of the present invention have been described above, the present invention is not limited thereto, and can be appropriately modified without departing from the technical idea of the invention.

Figure 4:
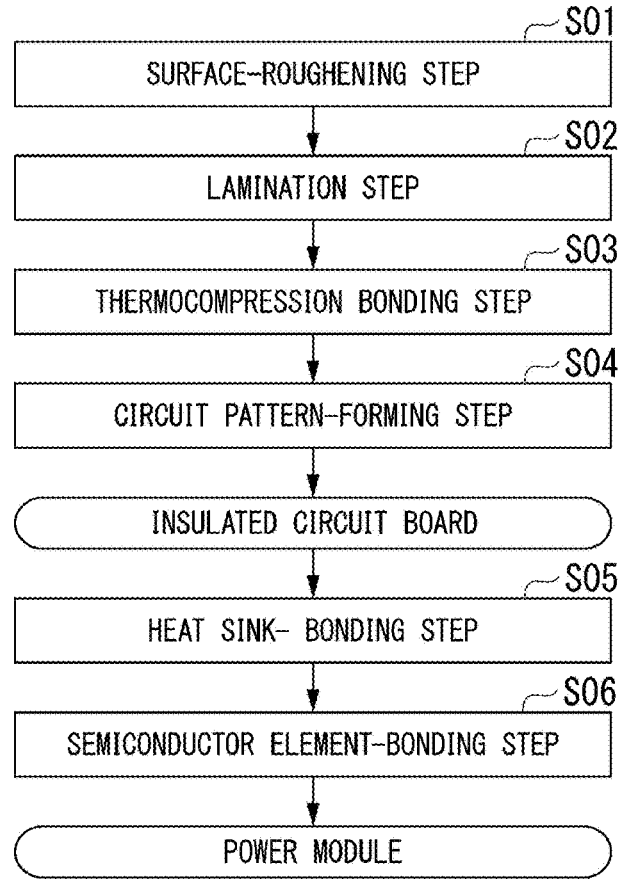
FIG. 4 is a flowchart showing a method for manufacturing the insulated circuit board according to the embodiment of the present invention.

In the present embodiment, a description has been given of the insulated circuit board being manufactured by the method for manufacturing the insulated circuit board shown in FIG. 4 and FIGS. 5(*a*) to 5(*d*); however, the present embodiment is not limited thereto.

In the present embodiment, the metal sheet material for forming the circuit layer is described as being composed of oxygen-free copper, but the metal sheet is not limited thereto, and may be made of another metal composed of copper or a copper alloy or may be made of another metal such as aluminum or an aluminum alloy. Furthermore, a structure in which a plurality of metals are laminated may be adopted.

In the present embodiment, the metal substrate is described as being composed of oxygen-free copper, but the present embodiment is not limited thereto, and the metal substrate may be made of another copper or a copper alloy or may be made of another metal such as aluminum or an aluminum alloy. Furthermore, a structure in which a plurality of metals are laminated may be adopted.

In addition, in the present embodiment, a description has been given in which a power module is configured by mounting a semiconductor element on an insulated circuit board; however, the present invention is not limited thereto. For example, a configuration of an LED module in which a LED element is mounted on the circuit layer of the insulated circuit board may be adopted, or a configuration of a thermoelectric module in which a thermoelectric element is mounted on the circuit layer of the insulated circuit board may be adopted.

EXAMPLES

The results of a confirmation experiment conducted to confirm the effect of the present invention will be described below.

A metal substrate (40 mm×40 mm×thickness of 2 mm) formed of a rolled plate made of oxygen-free copper and a metal sheet material (40 mm×40 mm×thickness of 0.5 mm) serving as the circuit layer were prepared, and roughened plating layers were formed on bonding surfaces between the metal substrate and the insulating resin layer, and between the metal sheet material and the insulating resin layer by the direct current electrolytic plating method and the PR pulse electrolytic plating method described in the above-described embodiment. Table 1 shows plating conditions of Examples 1 to 7 and Comparative Examples 1 and 2.

A sheet material (40 mm×40 mm×thickness of 0.15 mm) composed of a resin composition containing an epoxy resin containing boron nitride as a filler was disposed on a surface on which the roughened plating layer of the metal substrate was formed.

In addition, the metal sheet material serving as the circuit layer was laminated on one surface of the sheet material composed of this resin composition so that the surface on which the roughened plating layer was formed faced the sheet material side of the resin composition.

The metal substrate, the sheet material composed of the resin composition, and the metal sheet material, which had been laminated as described above, were pressurized and heated in the lamination direction, the resin composition was cured to form an insulating resin layer, and the metal substrate and the insulating resin layer, and the insulating resin layer and the metal sheet material were bonded to each other, thereby obtaining an insulated circuit board. A pressurizing pressure in the lamination direction was 10 MPa, a heating temperature was 180° C., and a holding time at the heating temperature was 60 minutes.

The following items were evaluated for the metal sheet materials and insulated circuit boards obtained in Examples 1 to 7 and Comparative Examples 1 and 2 as described above.

(Maximum Width W of Surface crystal grain of Metal Sheet Material)

A cross section of the metal sheet material on which the roughened plating layer was formed along the thickness direction was observed by SEM (1000-fold magnification), and a maximum width W of the surface crystal grain located on the outermost surface of the sheet surface was measured. As the maximum width W, a value measured at an interface between the main sheet body and the roughened plating layer was used.

That is, an interface between the main sheet body and the roughened plating layer, which was observed in the cross section of the main sheet body and the roughened plating layer along the thickness direction, was observed with a scanning electron microscope (SEM) (1000-fold magnification), the measurement of the maximum width of the surface crystal grain in a field of view of 85 μm×120 μm was performed three times, and the maximum width W is shown in Table 1 as the maximum value among the three measurements.

(Protrusion Height H of Engagement Protrusions)

A cross section of the metal sheet material on which the roughened plating layer was formed along the thickness direction was observed by SEM (5000-fold magnification), and the protrusion height H of the engagement protrusions was measured.

That is, a cross section of the roughened plating layer along the thickness direction was observed by SEM (5000-fold magnification), and in all engagement protrusions observed in a field of view of 16 μm×23 μm, each distance from the reference line connecting valley bottoms on both sides of each engagement protrusion to the top of the engagement protrusion was measured, and an average value of the obtained values was determined as the protrusion height of the engagement protrusions in a field of view of 16 μm×23 μm. This measurement was performed three times, and an average value thereof is shown in Table 1 as the protrusion height H of the engagement protrusions.

(Number N of Engagement Protrusions Present in Surface crystal grain with Maximum Width)

A cross section of the metal sheet material on which the roughened plating layer was formed along the thickness magnification), the number of the engagement protrusions present in the surface crystal grain with the maximum width was measured, and the measurement result is shown in Table 1 as the number N of the engagement protrusions in the maximum width W.

(N×H/W)

N×H/W was calculated from the maximum width W of the surface crystal grain located on the outermost surface of the sheet surface, the number N of the engagement protrusions present in the surface crystal grain with the maximum width, and the protrusion height H of the engagement protrusions, which were measured as described above.

(Evaluation of Adhesion)

A 90-degree peeling test in accordance with JIS K 6854-1: (1999) was carried out to confirm the peeled-off portion, and the adhesion between the insulating resin layer and the circuit layer was evaluated. The evaluation result is shown in Table 1.

TABLE 1

| | | Surface-roughening step | | | Bonded interface | | | | |
| | | Direct current electrolysis | | PR pulse electrolysis | Surface crystal grain | Engagement protrusion | | | |
| | | Current density (A/dm$^2$) | Application time (second) | Application time (second) | Maximum width W (μm) | The number N (pieces) | Protrusion height H (μm) | N × H/W | Evaluation Peeling test |
|---|---|---|---|---|---|---|---|---|---|
| Examples of the present invention | 1 | 3 | 30 | 30 | 12 | 7 | 1.1 | 0.64 | Peeling occurred inside resin layer |
| | 2 | 3 | 30 | 45 | 15 | 7 | 1.1 | 0.51 | Peeling occurred inside resin layer |
| | 3 | 3 | 30 | 60 | 8 | 5 | 1.2 | 0.75 | Peeling occurred inside resin layer |
| | 4 | 3 | 30 | 90 | 38 | 21 | 2.0 | 1.11 | Peeling occurred inside resin layer |
| | 5 | 3 | 30 | 120 | 50 | 20 | 2.3 | 0.92 | Peeling occurred inside resin layer |
| | 6 | 3 | 30 | 150 | 29 | 11 | 2.5 | 0.95 | Peeling occurred inside resin layer |
| | 7 | 3 | 30 | 300 | 45 | 14 | 3.2 | 1.00 | Peeling occurred inside resin layer |
| Comparative Examples | 1 | — | — | 30 | 45 | 14 | 1.0 | 0.31 | Peeling occurred at bonded interface |
| | 2 | — | — | 30 | 30 | 7 | 1.5 | 0.35 | Peeling occurred at bonded interface | direction was observed by SEM (1000- to 5000-fold magnification), and the number N of the engagement protrusions present in the surface crystal grain with the maximum width was measured.

That is, an interface between the main sheet body and the roughened plating layer, which was observed in the cross section of the main sheet body and the roughened plating layer along the thickness direction, was observed with a scanning electron microscope (SEM) (1000- to 5000-fold In Comparative Example 1, only the PR pulse electrolytic plating method was performed without performing the direct current electrolytic plating method, and a value of N×H/W was 0.31. As a result of evaluating the adhesion, peeling occurred at the bonded interface between the insulating resin layer and the circuit layer, and the adhesion between the insulating resin layer and the circuit layer was insufficient.

In Comparative Example 2, only the PR pulse electrolytic plating method was performed without performing the direct current electrolytic plating method, and a value of N×H/W was 0.35. As a result of evaluating the adhesion, peeling occurred at the bonded interface between the insulating resin layer and the circuit layer, and the adhesion between the insulating resin layer and the circuit layer was insufficient.

In Examples 1 to 7 according to the present invention, the direct current electrolytic plating method was performed, and the PR pulse electrolytic plating method was then performed to form the roughened plating layer, and a value of N×H/W was 0.5 or greater. As a result of evaluating the adhesion, peeling occurred inside the insulating resin layer, and the adhesion between the insulating resin layer and the circuit layer was excellent.

According to Examples of the present invention, it was confirmed from the above test results that a metal sheet material having excellent adhesion to a laminated resin member, a layered body in which the metal sheet material and resin member are laminated, and an insulated circuit board can be provided.

REFERENCE SIGNS LIST

10: Insulated circuit board (layered body)
12: Insulating resin layer (resin member)
13: Circuit layer
30: Metal sheet material

What is claimed is:

1. A metal sheet material made of copper or a copper alloy, comprising: a main sheet body; and a roughened plating layer that is formed on an outermost surface layer of the main sheet body, wherein an engagement protrusion that protrudes toward an opposite side to the main sheet body and has a widening portion that gradually widens in width toward a tip end side in a protrusion direction is formed in the roughened plating layer, in a cross section of the main sheet body and the roughened plating layer along a thickness direction, a plurality of the engagement protrusions are formed on a surface crystal grain that is located on the outermost surface of the main sheet body, when an interface between the main sheet body and the roughened plating layer, which is observed in the cross section of the main sheet body and the roughened plating layer along the thickness direction, is observed with a scanning electron microscope at a 1000-fold magnification, a measurement of a maximum width of the surface crystal grain in a field of view of 85 μm×120 μm is performed three times, and the maximum width of the surface crystal grain denoted by W (unit: μm) is defined as a maximum value among three measurements, the maximum width of the surface crystal grain is 3 μm or greater and 1000 μm or less, and when a number of the engagement protrusions in the maximum width of the surface crystal grain is denoted by N, and a protrusion height of the engagement protrusions is denoted by H (unit: μm), wherein N×H/W is 1.11 or smaller.

2. The metal sheet material according to claim 1, wherein the protrusion height of the engagement protrusions is 0.1 μm or greater.

3. A layered body comprising:
the metal sheet material according to claim 1; and
a resin member laminated on a sheet surface of the metal sheet material,
wherein the resin member engages with the engagement protrusions of the metal sheet material at a bonded interface between the resin member and the metal sheet material.

4. An insulated circuit board, comprising:
an insulating resin layer; and
a circuit layer formed on one surface of the insulating resin layer,
wherein the circuit layer is formed with the metal sheet material according to claim 1 bonded to the one surface of the insulating resin layer, and
the insulating resin layer engages with the engagement protrusions of the metal sheet material at a bonded interface between the insulating resin layer and the circuit layer.

5. A metal sheet material manufacturing method for manufacturing the metal sheet material according to claim 1, the method comprising:
performing direct current electrolytic plating and then PR pulse electrolytic plating on the main sheet body to form the roughened plating layer on the outermost surface layer of the main sheet body.

* * * * *